United States Patent
Brown et al.

(10) Patent No.: US 7,541,289 B2
(45) Date of Patent: Jun. 2, 2009

(54) PROCESS FOR REMOVING HIGH STRESSED FILM USING LF OR HF BIAS POWER AND CAPACITIVELY COUPLED VHF SOURCE POWER WITH ENHANCED RESIDUE CAPTURE

(75) Inventors: Karl M. Brown, Mountain View, CA (US); John A. Pipitone, Livermore, CA (US); Vineet H. Mehta, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 215 days.

(21) Appl. No.: 11/626,151

(22) Filed: Jan. 23, 2007

(65) Prior Publication Data

US 2008/0014747 A1 Jan. 17, 2008

Related U.S. Application Data

(60) Provisional application No. 60/830,945, filed on Jul. 13, 2006.

(51) Int. Cl.
*H01L 21/302* (2006.01)

(52) U.S. Cl. .......................... 438/706; 216/68; 156/345
(58) Field of Classification Search ................ 438/689, 438/706, 710, 712; 216/67, 68, 69, 70; 156/345
See application file for complete search history.

(56) References Cited

U.S. PATENT DOCUMENTS

| 5,916,454 | A | * | 6/1999 | Richardson et al. ........... 216/67 |
| 6,074,516 | A | * | 6/2000 | Howald et al. ......... 156/345.24 |
| 6,423,175 | B1 | * | 7/2002 | Huang et al. ........... 156/345.51 |
| 2002/0086118 | A1 | * | 7/2002 | Chang et al. ................. 427/447 |
| 2004/0180158 | A1 | * | 9/2004 | Lin et al. .................... 428/34.6 |
| 2004/0224128 | A1 | * | 11/2004 | Chang et al. ................. 428/141 |
| 2005/0064248 | A1 | * | 3/2005 | O'Donnell et al. .......... 428/702 |
| 2006/0110620 | A1 | * | 5/2006 | Lin et al. .................... 428/650 |
| 2007/0215278 | A1 | * | 9/2007 | Furuse et al. ............. 156/345.1 |

* cited by examiner

*Primary Examiner*—Kin-Chan Chen
(74) *Attorney, Agent, or Firm*—Law Office of Robert M. Wallace

(57) ABSTRACT

A method of fabricating multilayer interconnect structures on a semiconductor wafer begins by roughening the interior surface of a metal lid to a surface roughness in excess of SA 2000 with a reentrant surface profile, and installing the metal lid as the ceiling of a plasma clean reactor chamber having a wafer pedestal facing the interior surface of the ceiling.

3 Claims, 4 Drawing Sheets

PROCESS FOR REMOVING HIGH STRESSED FILM USING LF OR HF BIAS POWER AND CAPACITIVELY COUPLED VHF SOURCE POWER WITH ENHANCED RESIDUE CAPTURE

CROSS-REFERENCE TO RELATED APPLICATIONS

This application claims the benefit of U.S. Provisional Application Ser. No. 60/830,945, filed Jul. 13, 2006.

BACKGROUND OF THE INVENTION

Fabrication of multilayer conductor structures on a semiconductor substrate involves deposition of a planar conductor pattern and a covering dielectric film for each layer of the multilayer structure. In addition, the stacked layers are interconnected by vertical conductors between the layers. These require formation of vertical holes or vias through the overlying dielectric layer to expose a portion or face of the underlying conductor, followed by formation of a conductor in the via. Formation of the conductor in the via is difficult because the via is a small (65 nm or less) high aspect ratio opening (e.g., one in which the depth is twice the diameter). Moreover, a barrier layer, an adhesion layer and a seed layer must first be deposited on the via surfaces before the conductor is deposited to fill the via. If the conductor is copper, then a thin film barrier layer of tantalum nitride is deposited on the dielectric surfaces of the via or opening, (to block migration of copper atoms), a thin film tantalum adhesion layer is deposited over the barrier layer and a thin film copper seed layer is deposited over the adhesion layer. Thereafter, copper is deposited to fill the via to form the vertical interlayer conductor.

The via or vertical opening is formed by a dielectric etch step that exposes a portion of the planar conductor at the bottom of the via. This step leaves residue of the etched dielectric material on the surface of the planar conductor exposed at the bottom of the via. In order to obtain electrical contact between the vertical interlayer conductor and the planar conductor, formation of the vertical conductor must be preceded by a thorough removal of the dielectric residue from the exposed surface of the planar conductor at the bottom of the via. This removal step may be referred to as a "preclean" step and is typically carried out by sputter etching in an inert species plasma (e.g., an argon plasma). The removed or sputtered residue accumulates on the chamber interior surfaces and is therefore not redeposited on the wafer. This preclean step is preferably carried out with sufficient plasma ion density to achieve an etch (removal) rate of about 300 to 500 Å/min. This requires a high plasma ion density, which is readily achieved with an inductively coupled plasma. For this purpose, the preclean step is carried out in a reactor chamber depicted in FIG. 1 having an inductive coil 10 overlying a ceiling 12 and an RF source 14 (e.g., 2 MHz) coupled to the coil 10 through an impedance match 15. In order to guarantee plasma ions reach the bottom of each via to clean the exposed planar conductor surface, a high frequency bias voltage source 16 (e.g., 13.56 MHz) is coupled through an impedance match 17 to a wafer support pedestal 18 that faces the ceiling 12. The ceiling 12 must be formed of a non-conductor, such as quartz, to permit power to be inductively coupled through it from the coil 10 into the chamber interior. A process gas supply 19 furnishes an inert gas such as argon into the chamber interior.

FIG. 2 depicts a cross-sectional view of a portion of the wafer surface immediately prior to the preclean step. A planar copper conductor 20 lies in a trench formed in an underlying dielectric layer 22 and is covered by an overlying dielectric layer 24. A via 26 is formed by a dielectric etch step as a high aspect ratio opening. A small portion of the insulating material etched from the overlying dielectric layer 24 during the etch step contributes to a thin residue or film 28 covering the otherwise exposed top surface of the planar conductor 20. During the preclean step, a wafer 30 is placed on the pedestal 18 and argon gas (for example) is introduced into the reactor chamber of FIG. 1 from the process gas supply 19. RF plasma source power is applied by the RF generator 14 to the coil 10 to generate a high density plasma in the chamber and RF plasma bias power is applied by the RF source 16 to the wafer pedestal to create sufficient bias voltage on the wafer to realize an etch rate of 300 Å/min at the exposed surface of the planar conductor 20 at the bottom of the via 26 (FIG. 2). The residue that is sputtered during this step migrates upwardly through the via 26 and eventually is deposited or captured on chamber interior surfaces. The residue that is thus deposited on the interior surface of the ceiling 12 must adhere to the ceiling 12 until removal of the wafer 30 from the chamber upon completion of the preclean step. Otherwise, the reside may fall back onto the wafer and contaminate it. Conventionally, the dielectric layer 24 was silicon dioxide, producing a silicon dioxide residue that readily adheres to the interior surface of the quartz ceiling 12. The interior surface of the quartz ceiling 12 may be roughened by grit blasting (for example) to enhance the adhesion of the residue and avoid flaking of the residue from the ceiling otherwise caused by temperature variations of the ceiling during processing. The roughness of the quartz ceiling interior surface may be increased to an arithmetic mean surface roughness (RA) value of 150 without cracking the quartz. Higher RA values may crack the quartz, which would make the residue film deposited on the ceiling more vulnerable to flaking from temperature variations. The RA value may be measured with a conventional profilometer and corresponds to the arithmetic mean ratio between minimum and maximum peak heights on the surface. Such a reactor performs well with silicon dioxide residues, the quartz ceiling providing excellent adhesion of the silicon dioxide residue.

One disadvantage is that the interior surface of the quartz ceiling 12 becomes less rough during repetitive use and must be removed, cleaned and roughened again. Eventually the quartz ceiling or dome 12 must be replaced, incurring a significant cost.

The latest generation of integrated circuits employ high performance dielectric materials as the interlayer insulator layer 24 of FIG. 2. The residue 28 produced during the preclean sputter etching of such materials can contain SiON, SiOC:N, polymide or other compositions, all of which have very poor adhesion to the interior surface of the quartz ceiling 12 compared to silicon dioxide residues of the earlier conventional structures. As a result, the residue captured on the interior surface of the ceiling 12 during the preclean step tends to flake off the ceiling 12 and onto the wafer 30 during processing. This problem cannot be solved by increasing the roughness of the quartz ceiling interior surface beyond RA 150 or RA 200 because the quartz material would crack.

SUMMARY OF THE INVENTION

A method of fabricating multilayer interconnect structures on a semiconductor wafer begins by roughening the interior surface of a metal lid to a surface roughness in excess of RA 2000 with a reentrant surface profile, and installing the metal lid as the ceiling of a plasma clean reactor chamber having a wafer pedestal facing the interior surface of the ceiling. Conductive vias are formed in a dielectric layer of the semiconductor wafer, which are then covered with an overlying dielectric layer. High aspect ratio openings are etched through the overlying dielectric layer to the conductive via to expose a face of the conductive via. This step is followed by a preclean step for removing residue from the exposed face of each conductive via while capturing at least a portion of the residue on the roughened interior surface of the lid. This preclean step consists of: (1) placing the wafer on the wafer pedestal of the plasma clean reactor chamber and introducing an inert gas into the preclean reactor chamber; (2) coupling VHF plasma source power of 60 MHz or greater to the wafer pedestal with sufficient power to establish an etch rate on the order of 200-500 Å/min; and (3) coupling LF or HF plasma bias power of 13.56 MHz or less with sufficient power to realize the etch rate at the bottom surfaces of the high aspect ratio openings, and removing the wafer from the plasma clean reactor chamber. The method continues with forming a barrier layer on sidewall surfaces of the high aspect ratio openings, and depositing a conductor over the barrier layer in each high aspect ratio opening.

DETAILED DESCRIPTION OF THE INVENTION

The problem of flaking of sputtered materials such as SiON, SiOC:N or polymide from the ceiling interior surface is solved by replacing the quartz ceiling with a metal (e.g., aluminum) ceiling and treating the metal ceiling interior surface with e-beam pulsing or metal arc-spraying (for example) to (a) increase its surface roughness to RA 2000 or more and (b) create a reentrant surface profile over the metal ceiling interior surface. The inductively coupled high density plasma source cannot couple RF power through the metal ceiling. This problem is solved by generating a high density plasma with VHF (60 MHz or above) plasma source power capacitively coupled through the wafer pedestal. Simultaneously, HF or LF bias power (below 14 MHz) is also applied to the wafer pedestal to attract plasma ions to the bottom of each high aspect ratio opening. The capacitively coupled VHF plasma source power (e.g., at about 900 Watts) produces a sufficiently high ion density for an etch rate of 300-500 Å/min. The HF or LF bias power is applied at a low level (e.g., as low as 100 Watts) that is sufficient to realize this etch rate at the bottom or floor of each high aspect ratio opening.

Figure 1:
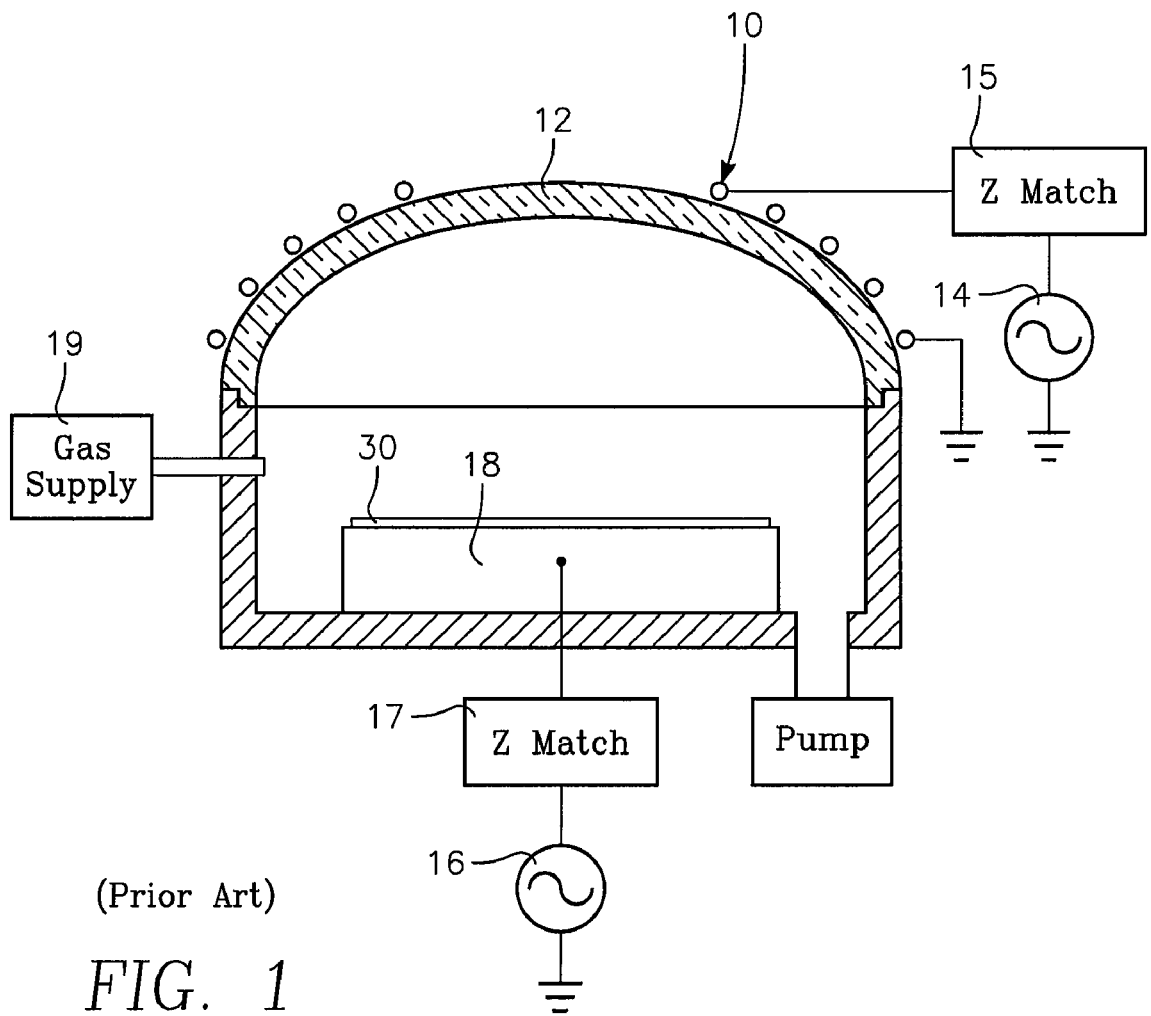
FIG. 1 depicts a conventional preclean plasma reactor of the prior art.
Figure 2:
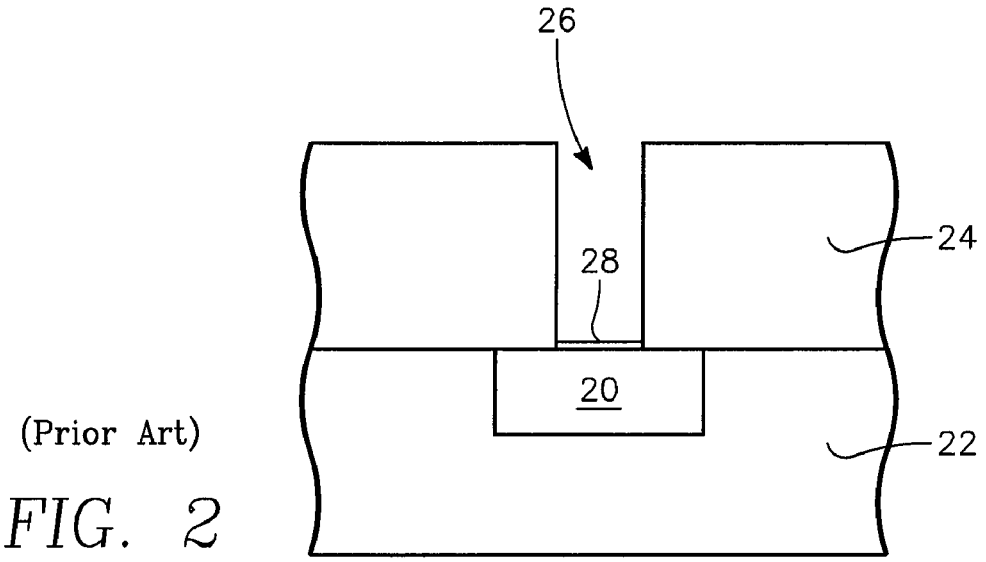
FIG. 2 is a cross-sectional view of a portion of a partially completed interlayer interconnect structure of an integrated circuit.
Figure 3:
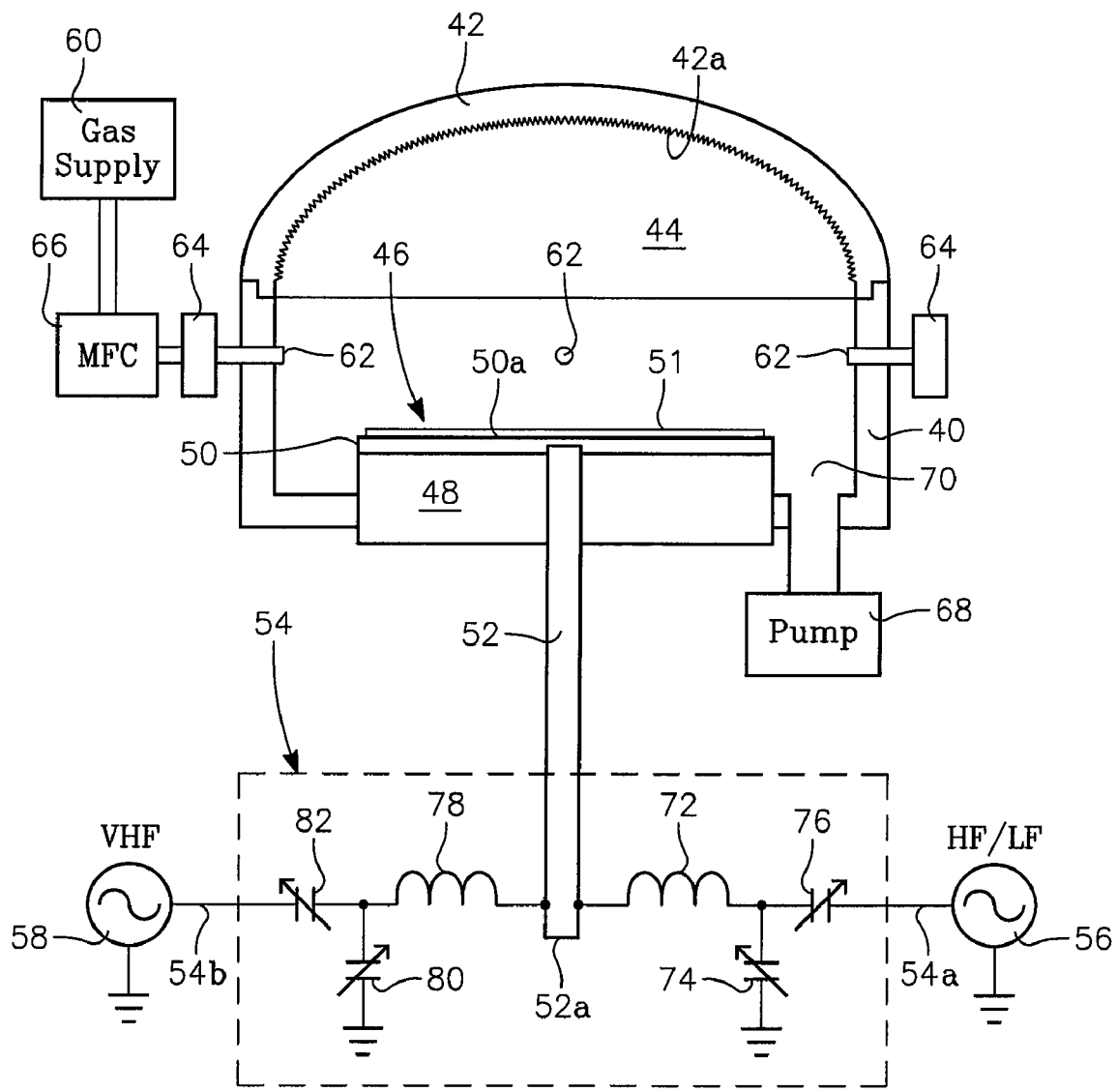
FIG. 3 depicts a preclean plasma reactor in accordance with the present invention.

Referring to FIG. 3, a preclean chamber has a cylindrical side wall 40 supporting a metal (e.g., aluminum) ceiling 42 to define a chamber 44. Within the chamber, a wafer support pedestal 46 faces the interior surface 42a of the metal ceiling 42. In a preferred embodiment, the pedestal 46 consists of an insulating (e.g., quartz) base 48 supporting a metal (e.g., titanium) plate 50 having a wafer support surface 50a. A semiconductor wafer 51, which has been processed to produce the partially completed interlayer structure of FIG. 2, is placed on the wafer support surface 50a. An elongate RF feed rod 52, which may be formed of copper, is connected to the conductive plate 50 and extends through the insulating base 48. A dual frequency RF impedance match network 54 is connected to the RF feed rod 52 at or near its bottom end 52a. An LF or HF bias power generator 56 applies RF power (at 13.56 MHz or less) to the LF or HF frequency side 54a of the impedance match network 54, while a VHF source power generator 58 applies RF power (at 60 MHz or greater) to the VHF side 54b of the impedance match network 54.

A gas supply 60 furnishes process gas, preferably an inert gas such as argon, into the chamber 44 through gas injection apparatus such as gas injection nozzles 62 that a fed through a common manifold 64. Gas flow from the gas supply 60 to the manifold 64 may be regulated by a mass flow controller 66. Chamber pressure is controlled by a vacuum pump 68 coupled to a pumping annulus 70 formed between the side wall 40 and the wafer support pedestal 46.

In a preferred embodiment, the LF or HF side 54a of the impedance match network 54 consists of a choke or inductor 72 coupled to the LF or HF power generator 56 through a capacitor network consisting of a variable shunt capacitor 74 and a variable load capacitor 76. The VHF side 54b of the impedance match network 54 consists of a choke or inductor 78 coupled to the VHF power generator 58 through a capacitor network consisting of a variable shunt capacitor 80 and a load capacitor 82. The variable capacitors 74, 76 of the low frequency side 54a are adjusted to produce an optimum impedance match at the output of the LF or HF power generator 56, while simultaneously the variable capacitors 80, 82 are adjusted to produce an optimum impedance match at the output of the VHF power generator 58. The inductance of the choke 72 on the low frequency side 54a is preferably selected to present a high impedance to VHF power from the VHF side 54b, while the inductance of the choke 78 is preferably selected to present a high impedance to LF or HF power from the low frequency side 54b. In this way, the low and high frequency sides 54a, 54b are at least somewhat isolated from one another for independent operation while the two power generators 56, 58 simultaneously apply RF power to the impedance match 54.

Figure 4:
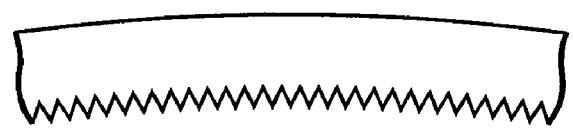
FIG. 4 depict a non-reentrant surface profile typical of the quartz ceiling surface of the conventional preclean plasma reactor of FIG. 1.
Figure 5A:
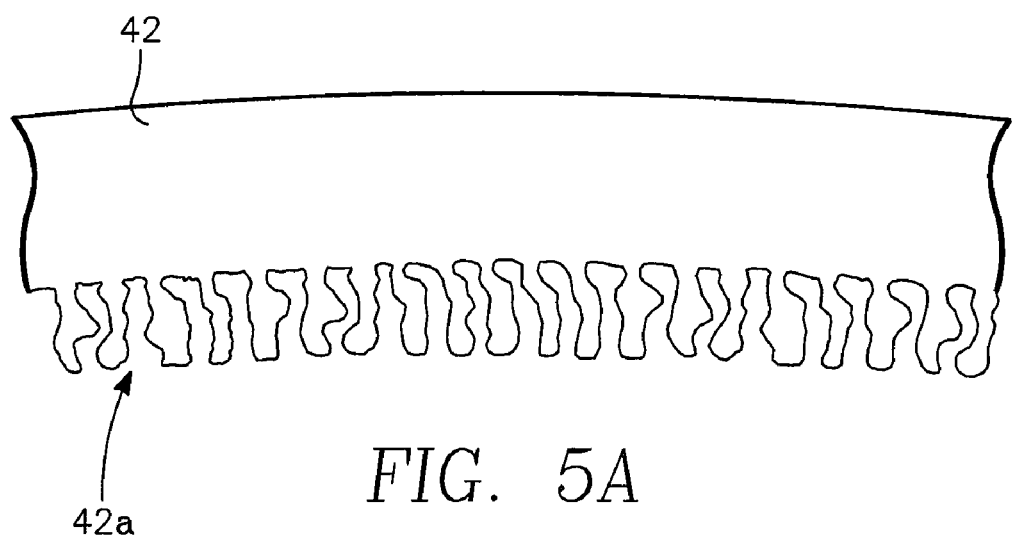
FIGS. 5A and 5B depict the reentrant surface profile of the arc-sprayed metal ceiling of the reactor of FIG. 3 in accordance with the present invention.
Figure 5B:
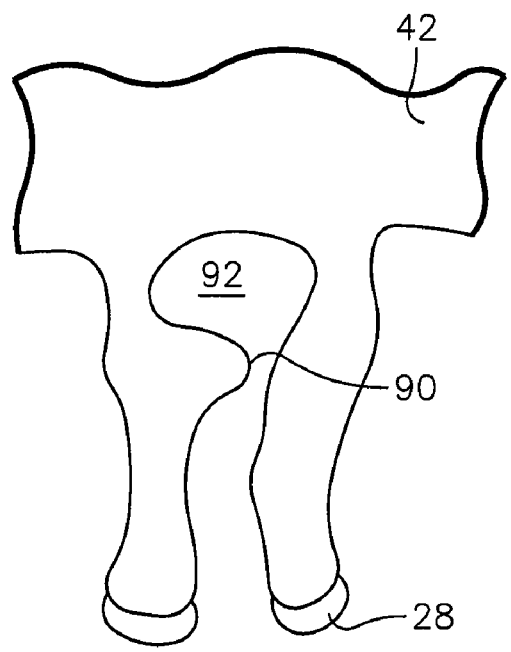

Prior to installation in the reactor of FIG. 3, the metal (aluminum) ceiling 42 is fabricated separately, either as the dome-shaped lid depicted in FIG. 3 or as a flat lid (for example), the fabrication process including a final step of roughening the ceiling interior surface 42a to an extremely high roughness value, e.g., an RA value of 2000 or more. This final roughening step is further carried out to produce a reentrant surface profile over the interior surface 42a. Processes such as grit blasting that can be employed to roughen quartz surfaces are generally incapable of producing a reentrant surface profile, instead producing a surface profile, such as that depicted in FIG. 4, in which the surface topology is fairly open. The roughening step employed to treat the metal ceiling interior surface 42a of FIG. 3 is carried out so as to form the reentrant surface profile depicted in FIGS. 5A and 5B, in which the surface profile includes topologies or curves that turn back upon themselves, to form protrusions 90 that block or at least partially block recesses 92 formed in the roughening step. The principal advantage of such a reentrant surface topology is that the residue 28 accumulates on each of the surface peaks but cannot cross over the reentrant cavities to join with residue on neighboring peaks. By thus maintaining separate unjoined residue "piles" on individual surface peaks, the residue 28 cannot form a continuous film across the surface, and it is therefore much less vulnerable to flaking caused by temperature fluctuations of the ceiling 12 during the preclean step. In contrast, with the open surface profile of FIG. 4, the residue 28 accumulates at first on the individual surface peaks but then readily forms bridges between the peaks to eventually form a continuous film, which is far more susceptible to cracking and flaking over even slight temperature variations of the ceiling 12.

One roughening treatment capable of achieving an RA value of 2000 or greater and a reentrant surface profile is arc-spraying. If the lid or ceiling 42 is aluminum, then an aluminum arc-spraying treatment is carried out by exposing the ceiling interior surface 42a to a pair of aluminum wires slightly separated from one another and applying a very high voltage across the two aluminum wires that is sufficient to generate a continuous arc of aluminum.

Another roughening treatment capable of achieving an RA value of 2000 or greater and a reentrant surface profile is electron beam (e-beam) pulsing, in which an electron beam is directed to the ceiling interior surface 42a and moved across the surface in a stepping motion, each step forming a roughened surface element corresponding to the electron beam diameter. The beam itself may not necessarily be pulsed, as the stepping motion leaves the beam at each surface element for a sufficient time window to form the desired roughness and then shifts the beam almost instantly to the next (or adjacent) surface element. The shift at the end of each step displaces the electron beam by a distance corresponding approximately to the beam diameter (or twice the beam diameter) or a slightly greater value.

In a preferred embodiment, the ceiling interior surface 42a is treated by the arc-spraying treatment described above followed by the pulsed e-beam treatment described above. If the ceiling is formed of aluminum, then the aluminum arc spraying treatment provides a roughened surface and also provides the reentrant surface profile. Roughness of the surface is then enhanced to RA 2000 and beyond by the electron beam pulsing or treatment described above. Optionally, grit blasting or other treatments may also be employed as supplementary steps.

Figure 6:
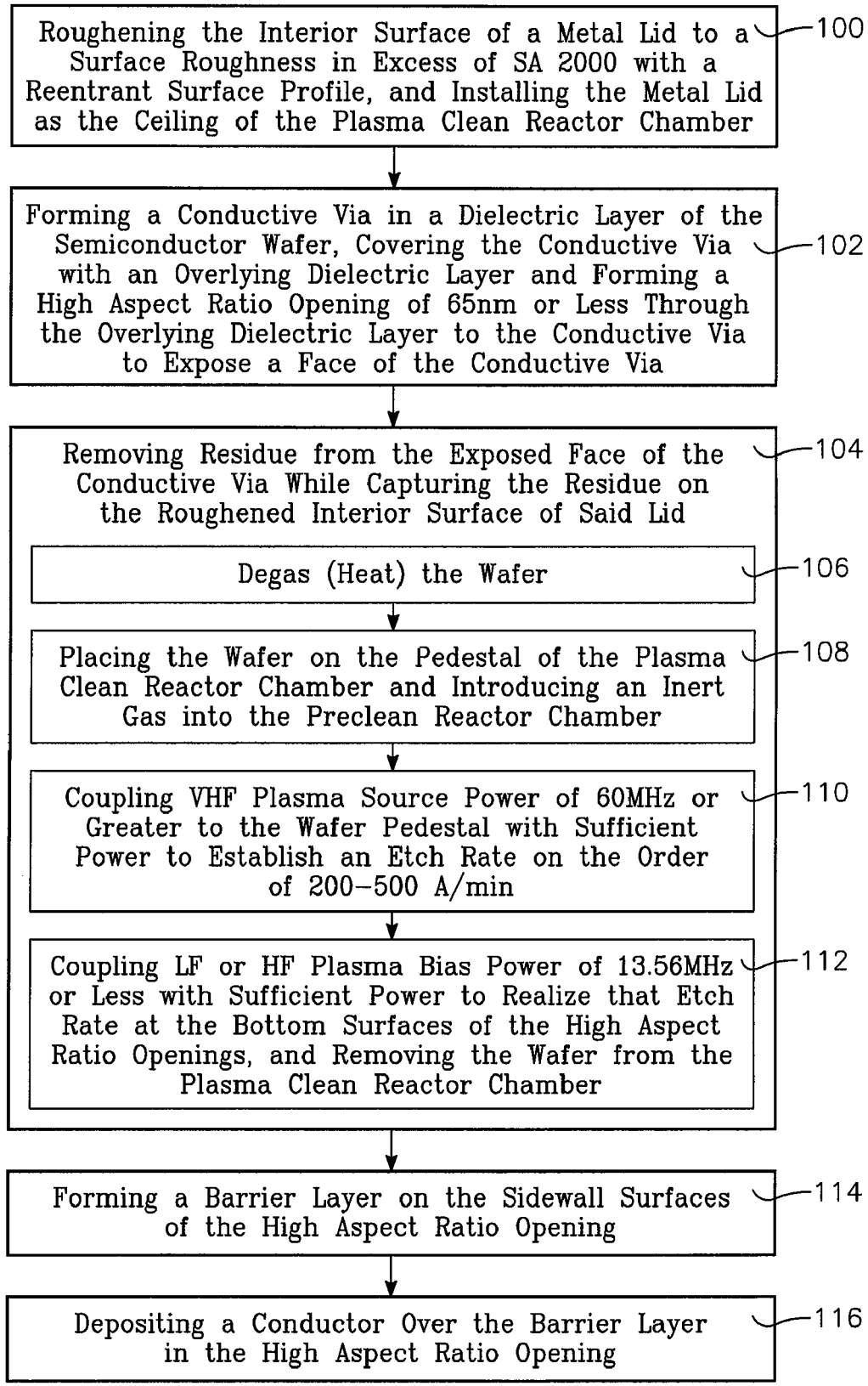
FIG. 6 is a block flow diagram of a process embodying the present invention.

A process embodying the invention is depicted in FIG. 6. The process of FIG. 6 begins with the step of roughening the interior surface 42a of the metal lid or ceiling 42 to a surface roughness in excess of RA 2000 with a reentrant surface profile (block 100 of FIG. 6). As described above, this roughening step may be carried out by a combination of aluminum arc-spraying and e-beam pulsing. Then, the metal lid or ceiling 42 with roughened interior surface 42a is installed on the plasma clean reactor chamber as shown in FIG. 3 with the ceiling interior surface facing the wafer pedestal 46 (block 102 of FIG. 6).

In the next step (block 102 of FIG. 6), the wafer 51 (FIG. 3) is prepared (in another reactor or chamber) by forming the conductive via 20 in a dielectric layer 22 (FIG. 2) of the semiconductor wafer 51, covering the conductive via 20 with an overlying dielectric layer 24 and forming a high aspect ratio opening 26 of 65 nm or less through the overlying dielectric layer 26 to the conductive via 20 to expose a face of the conductive via 20 in registration with the opening 26. The high aspect ratio opening 26 is formed by a dielectric etch step. This dielectric etch step leaves a residue 28 of material removed from the dielectric layer 24 (in forming the opening 26) on the interior surfaces of the opening, and particularly on the exposed surface of the via conductor 20.

The preclean step (block 104 of FIG. 6) is then carried out to remove the residue 28 from the exposed face of the conductive via 20. Simultaneously, as part of the preclean step, at least a portion (if not all) of the residue is captured on the roughened interior ceiling surface 42a. If the overlying dielectric layer is a carbon-containing or nitrogen-containing silicon-oxygen compound or a polymide, then the residue material does not adhere well to the ceiling unless is has a roughness of RA 2000 or greater and a reentrant surface profile. The step of block 100 endows the ceiling interior surface 42a with a roughness of RA 2000 or greater and a reentrant surface profile.

The step of block 104 is carried out by the following sub-steps: The wafer is degassed by heating it sufficiently to extract all water vapor from it (block 106). The wafer is placed on the wafer pedestal 46 of the plasma clean reactor chamber and an inert gas is introduced into the preclean reactor chamber (block 108). VHF plasma source power of 60 MHz or greater is coupled to the wafer pedestal 46 through the impedance match 54 with sufficient power to establish an etch rate on the order of 300-500 Å/min (block 110). LF or HF plasma bias power (of 13.56 MHz or less) is applied to the pedestal 46 through the impedance match 54 simultaneously with the application of the VHF source power. The bias power is applied at a sufficient power level (e.g., 100-300 Watts) to realize the desired etch rate (Å/min) at the bottom surfaces of the high aspect ratio openings (block 112).

The wafer is then removed from the plasma clean reactor chamber of FIG. 3, and moved to other chamber or chambers where the multilayer interconnect structure is completed. To accomplish this, a barrier/adhesion/seed layer on sidewall surfaces of the high aspect ratio opening 26 of FIG. 2 (block 114 of FIG. 6). This layer may include (for a copper conductor) a tantalum nitride thin film barrier layer, an overlying tantalum thin film adhesion layer and a thin film copper seed layer overlying the adhesion layer. Finally, the high aspect ratio opening 26 is filled, e.g., with copper (block 116).

This process solves the contamination problem encountered in the removal of residues having less adhesion to interior chamber surfaces, such as SiOC, SiOC:N and polymide residues. With the foregoing process, such residues adhere without flaking to the ceiling during the entire preclean etch step. In the preferred embodiment, the ceiling interior surface 42a is treated by aluminum arc spraying to achieve the reentrant surface profile of FIGS. 5A and 5B and is also subject to the stepped electron beam treatment to enhance surface roughness. The invention provides two significant advantages: (a) the metal ceiling interior surface 42a captures and holds the poorly adhering residues (such as SiOC, SiOC:N and polymide) over wide temperature variations of the ceiling 42 during the entire preclean process, and (b) the metal ceiling does not wear or lose its roughness over extended usage.

The e-beam and arc-spray treated metal ceiling 42 has a life of about 5000 wafers when first installed in the reactor and a low cost relative to the quartz ceiling of the prior art. The process of FIG. 6 provides a preclean etch rate of the SiOC, SiOC:N or polymide residue 28 of 300 to 500 Å/min with less that 3% deviation across the diameter of the wafer (on the order of 12 inches) for a through-put of about 40 wafers/hour in the preclean step.

What is claimed is:

1. A method of processing a semiconductor wafer, comprising:
    roughening the interior surface of a metal lid to a surface roughness in excess of RA 2000 with a reentrant surface profile, and installing the metal lid as the ceiling of a plasma clean reactor chamber having a wafer pedestal facing the interior surface of the ceiling;

forming a conductive via in a dielectric layer of the semiconductor wafer, covering the conductive via with an overlying dielectric layer and forming a high aspect ratio opening of 65 nm or less through the overlying dielectric layer to the conductive via to expose a face of the conductive via;

removing residue from the exposed face of the conductive via while capturing at least a portion of said residue on the roughened interior surface of said lid, by:

(1) placing the wafer on the wafer pedestal of the plasma clean reactor chamber and introducing an inert gas into the preclean reactor chamber;

(2) coupling VHF plasma source power of 60 MHz or greater to the wafer pedestal with sufficient power to establish an etch rate on the order of 200-500 Å/min;

(3) coupling LF or HF plasma bias power of 13.56 MHz or less with sufficient power to realize said etch rate at the bottom surfaces of said high aspect ratio openings, and removing the wafer from said plasma clean reactor chamber;

forming a barrier layer on sidewall surfaces of said high aspect ratio opening; and depositing a conductor over said barrier layer in said high aspect ratio opening.

2. The method of claim 1 wherein the step of roughening comprises arc-spraying said interior surface of said metal lid and treating said interior surface with a stepped electron beam.

3. The method of claim 1 wherein the step of roughening comprises treating said interior surface by at least one of: (a) arc spraying, (b) electron beam pulsing, (c) grit blasting.

* * * * *